US008952747B1

(12) United States Patent
Shreeve

(10) Patent No.: US 8,952,747 B1
(45) Date of Patent: Feb. 10, 2015

(54) HIGH-POWER NON-LINEAR VOLTAGE REGULATOR

(71) Applicant: Marvell International Ltd., Hamilton (BM)

(72) Inventor: Robert W. Shreeve, Corvallis, OR (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/190,729

(22) Filed: Feb. 26, 2014

Related U.S. Application Data

(60) Provisional application No. 61/770,701, filed on Feb. 28, 2013.

(51) Int. Cl.
 *G05F 1/10* (2006.01)
 *H03K 19/0185* (2006.01)
 *H02M 3/156* (2006.01)

(52) U.S. Cl.
 CPC ....... *H02M 3/156* (2013.01); *H03K 19/018507* (2013.01)
 USPC .......................................... 327/538; 327/109

(58) Field of Classification Search
 USPC .............................................. 327/538
 See application file for complete search history.

(56) References Cited

U.S. PATENT DOCUMENTS

| 6,144,606 | A | * | 11/2000 | Pan | 365/226 |
| 6,459,554 | B1 | * | 10/2002 | Meiners et al. | 361/63 |
| 6,714,067 | B1 | * | 3/2004 | Farrenkopf | 327/589 |
| 6,891,426 | B2 | * | 5/2005 | Zeng et al. | 327/536 |
| 6,975,164 | B1 | * | 12/2005 | Matsui et al. | 327/541 |
| 7,439,798 | B2 | * | 10/2008 | Kouno et al. | 327/541 |
| 7,859,325 | B2 | * | 12/2010 | Chiu et al. | 327/540 |
| 2010/0315157 | A1 | * | 12/2010 | Na et al. | 327/539 |
| 2011/0080150 | A1 | * | 4/2011 | Wang et al. | 323/284 |

* cited by examiner

*Primary Examiner* — Ryan Jager

(57) ABSTRACT

A voltage regulator includes a comparing circuit configured to compare a first voltage reference to a second voltage reference and to generate an output. A first circuit applies gain to the output of the comparing circuit and buffers the output of the comparing circuit. A first transistor includes a gate in communication with an output of the first circuit, a first terminal in communication with a first voltage reference and a second terminal in communication with an output of the voltage regulator. A second circuit applies gain and buffers the output of the first circuit. A latching circuit receives an output of the second circuit. A voltage reference circuit generates the second voltage reference based on the output of the voltage regulator. A reference adjusting circuit receives an output of the latching circuit and selectively adjusts the second voltage reference.

18 Claims, 4 Drawing Sheets

HIGH-POWER NON-LINEAR VOLTAGE REGULATOR

CROSS-REFERENCE TO RELATED APPLICATIONS

This application claims the benefit of U.S. Provisional Application No. 61/770,701, filed on Feb. 28, 2013. The entire disclosure of the application referenced above is incorporated herein by reference.

FIELD

The present disclosure relates to voltage regulators, and more particularly to non-linear voltage regulators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Voltage regulators receive an input voltage reference and supply an output voltage reference to another circuit such as a chip core or output drivers. While the input voltage reference may vary, the voltage regulator attempts to regulate the output voltage reference. For example, fluctuation of the output voltage reference may need to be regulated within a predetermined range of a predetermined voltage level.

The voltage regulator may be implemented by an integrated circuit (IC) along with the chip core and/or the output drivers. To perform voltage regulation, the voltage regulator usually requires a relatively large capacitor that is either attached externally to a pin of the IC or integrated in the IC.

SUMMARY

A voltage regulator includes a comparing circuit configured to compare a first voltage reference to a second voltage reference and to generate an output. A first circuit is configured to apply gain to the output of the comparing circuit and to buffer the output of the comparing circuit. A first transistor includes a gate in communication with an output of the first circuit, a first terminal in communication with a first voltage reference and a second terminal in communication with an output of the voltage regulator. A second circuit is configured to apply gain to the output of the first circuit and to buffer the output of the first circuit. A latching circuit is configured to receive an output of the second circuit. A voltage reference circuit is configured to generate the second voltage reference based on the output of the voltage regulator. A reference adjusting circuit is configured to receive an output of the latching circuit and to selectively adjust the second voltage reference.

In other features, a capacitor is connected to the output of the voltage regulator. The capacitor has a value that is less than 20 nF.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
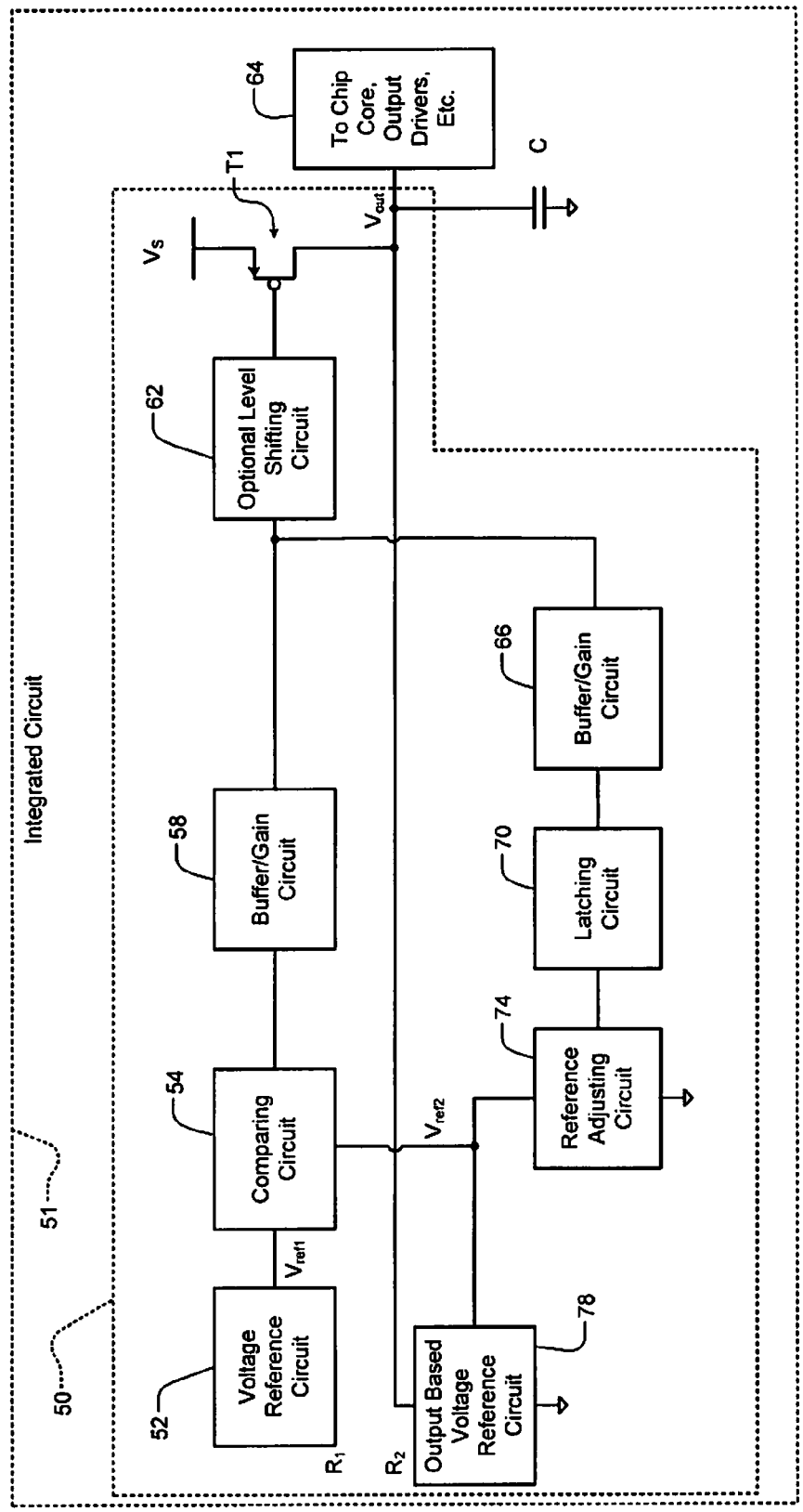
FIG. 1 is a functional block diagram and electrical schematic of an example of a voltage regulator according to the present disclosure.

FIG. 1 shows of an example of a voltage regulator 50 according to the present disclosure. The voltage regulator 50 may be implemented in an integrated circuit 51. A voltage reference circuit 52 generates and outputs a first voltage reference $V_{ref1}$ to a first input of a comparing circuit 54. A second input of the comparing circuit 54 receives a second voltage reference $V_{ref2}$. The comparing circuit 54 compares the first voltage reference $V_{ref1}$ to the second voltage reference $V_{ref2}$ and generates a high or low signal based on the comparison. The second voltage reference $V_{ref2}$ may be based on an output voltage of the voltage regulator 50.

A buffer/gain circuit 58 applies gain and provides buffering to a signal output by the comparing circuit 54. An optional level shifting circuit 62 may be used to adjust a signal level of the output of the buffer/gain circuit 58. For example, the level shifting circuit 62 may shift a voltage level from a first voltage level to a second voltage level.

An output of the level shifting circuit 62 (or the buffer/gain circuit 58) is input to a gate of a transistor T1. A first terminal of the transistor T1 is connected to a voltage supply $V_S$. A second terminal of the transistor T1 is connected to an output node of the voltage regulator $V_{out}$. In some examples, the output node of the voltage regulator 50 is connected to a chip core, output drivers, etc. 64 and a capacitor C. The transistor T1 is OFF when the output voltage $V_{out}$ is above a target voltage level and ON when the output voltage $V_{out}$ falls below the target voltage level.

An output of the buffer/gain circuit 58 is also connected to a buffer/gain circuit 66, which applies gain and provides buffering to the output of the buffer/gain circuit 58. The increased gain minimizes the possibility of a stable intermediate state and conditions the signal for input to a latching circuit 70. The latching circuit 70 forces an output of the buffer/gain circuit 66 either high or low and prevents stable intermediate states between high or low.

An output of the latching circuit 70 is input to a reference adjusting circuit 74. The output $V_{out}$ of the voltage regulator 50 is fed back a voltage reference circuit 78. The voltage reference circuit 78 and/or the reference adjusting circuit 74 set a value of the second voltage reference $V_{ref2}$ supplied to the comparing circuit 54. During one mode, the voltage reference circuit 78 sets the second voltage reference $V_{ref2}$, and during another mode, the voltage reference circuit 78 and the reference adjusting circuit 74 set the second voltage reference $V_{ref2}$. The reference adjusting circuit 74 helps to define an acceptable voltage range for the output voltage and to prevent the transistor T1 from oscillating on and off.

Figure 2:
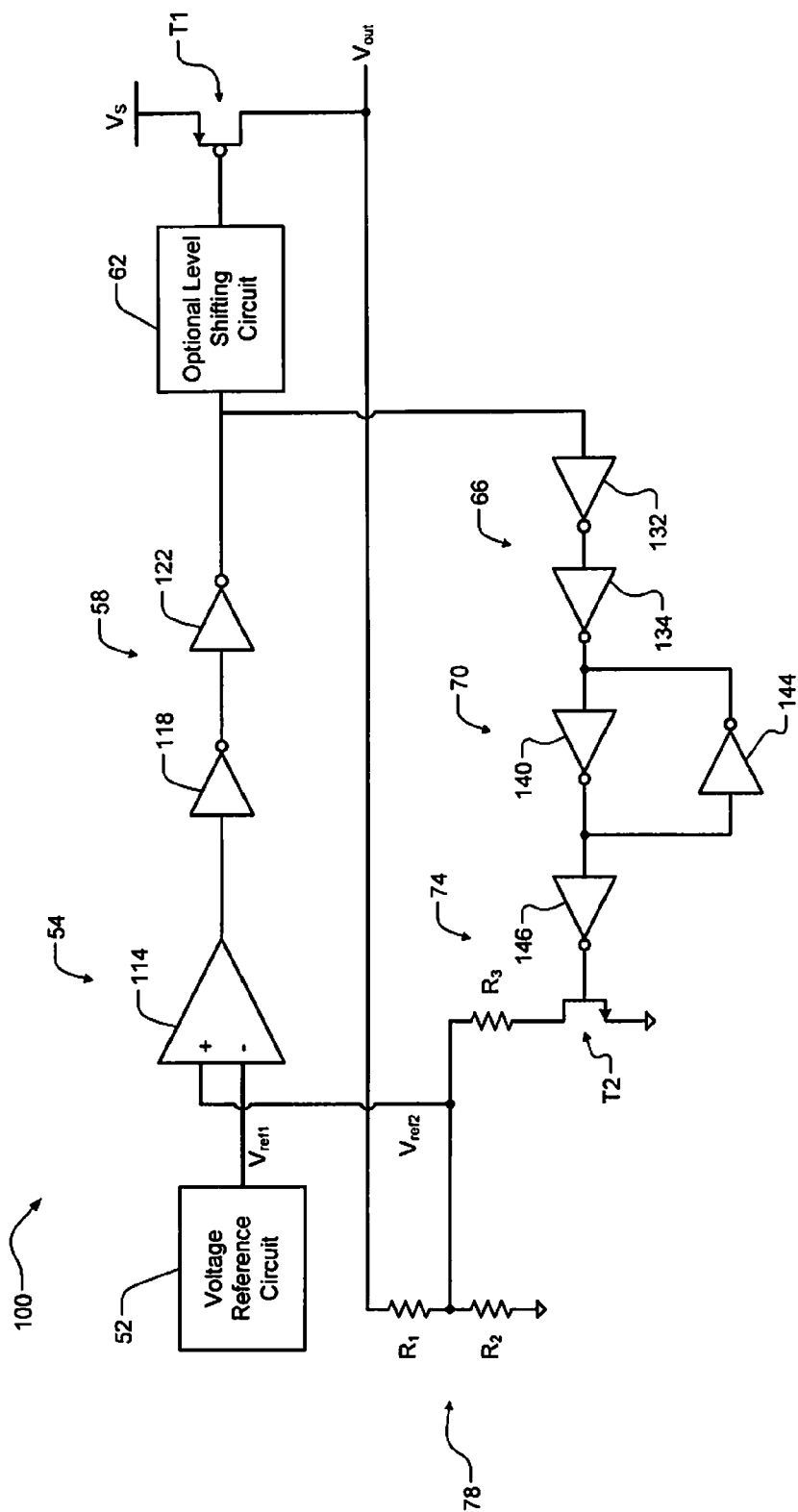
FIG. 2 is a functional block diagram and electrical schematic of another example of a voltage regulator according to the present disclosure.

FIG. 2 shows another example of a voltage regulator 100 according to the present disclosure. The voltage regulator 100 may be implemented in an integrated circuit. The voltage reference circuit 52 generates and outputs a first voltage reference $V_{ref1}$ and outputs the first voltage reference $V_{ref1}$ to the comparing circuit 54. The comparing circuit 54 compares the voltage reference $V_{ref1}$ to the second voltage reference $V_{ref2}$ and generates a high or low signal based on the comparison. The comparing circuit 54 may include an amplifier or operational amplifier (opamp) 114 having an inverting input connected to the voltage reference $V_{ref1}$ from the voltage reference circuit 52 and a non-inverting input connected to the second voltage reference $V_{ref2}$.

The second voltage reference $V_{ref2}$ may be based on an output voltage of the voltage regulator 100. The buffer/gain circuit 58 applies gain and provides buffering to the output of the comparing circuit 54. The buffer/gain circuit 58 may include first and second inverters 118 and 122, respectively, connected in series to an output of the comparing circuit 54. An output of the second inverter 122 is connected to an input of the optional level shifting circuit 62 (when used) or to the gate of the transistor T1. The transistor T1 may include a PMOS transistor.

The output of the buffer/gain circuit 58 is connected to the buffer/gain circuit 66, which provides increased gain and buffering to the output of the buffer/gain circuit 58. The buffer/gain circuit 66 may include first and second inverters 132 and 134 that are connected in series.

The latching circuit 70 is connected to the output of the buffer/gain circuit 66. The latching circuit 70 forces the output of the buffer/gain circuit 70 either high or low and prevents intermediate states. The latching circuit 70 may include a first inverter 140 and a second inverter 144. The second inverter 144 has an input connected to an output of the first inverter 142 and an output connected to the input of the first inverter 142.

The output of the latching circuit 70 is input to the reference adjusting circuit 74. The reference adjusting circuit 74 may include a resistor R3, an inverter 146, and a transistor T2. The inverter 146 includes an input connected to a gate of the transistor T2. The transistor T2 may include an NMOS transistor. One end of the resistor R3 is connected to a first terminal of the transistor T2. A second terminal of the transistor T2 is connected to a reference potential. Another end of the resistor R3 is connected to the output-based voltage reference circuit 78.

The output $V_{out}$ of the voltage regulator 100 is fed back to the voltage reference circuit 78. The voltage reference circuit 78 adjusts the output voltage $V_{out}$ to a voltage that is comparable to the first reference voltage $V_{ref1}$. The voltage reference circuit 78 and the reference adjusting circuit 74 set a value of the second voltage reference $V_{ref2}$ supplied to the comparing circuit 54. The voltage reference circuit 78 may include a voltage divider circuit including first and second resistors R1 and R2.

During one mode, the voltage reference circuit 78 sets the second voltage reference $V_{ref2}$, and during another mode, the voltage reference circuit 78 and the reference adjusting circuit 74 set the second voltage reference $V_{ref2}$. More particularly in FIG. 2, the resistor R3 is selectively connected to the resistors R1 and R2 to adjust the second reference voltage $V_{ref2}$ that is input to the comparing circuit 54.

Figure 3A:
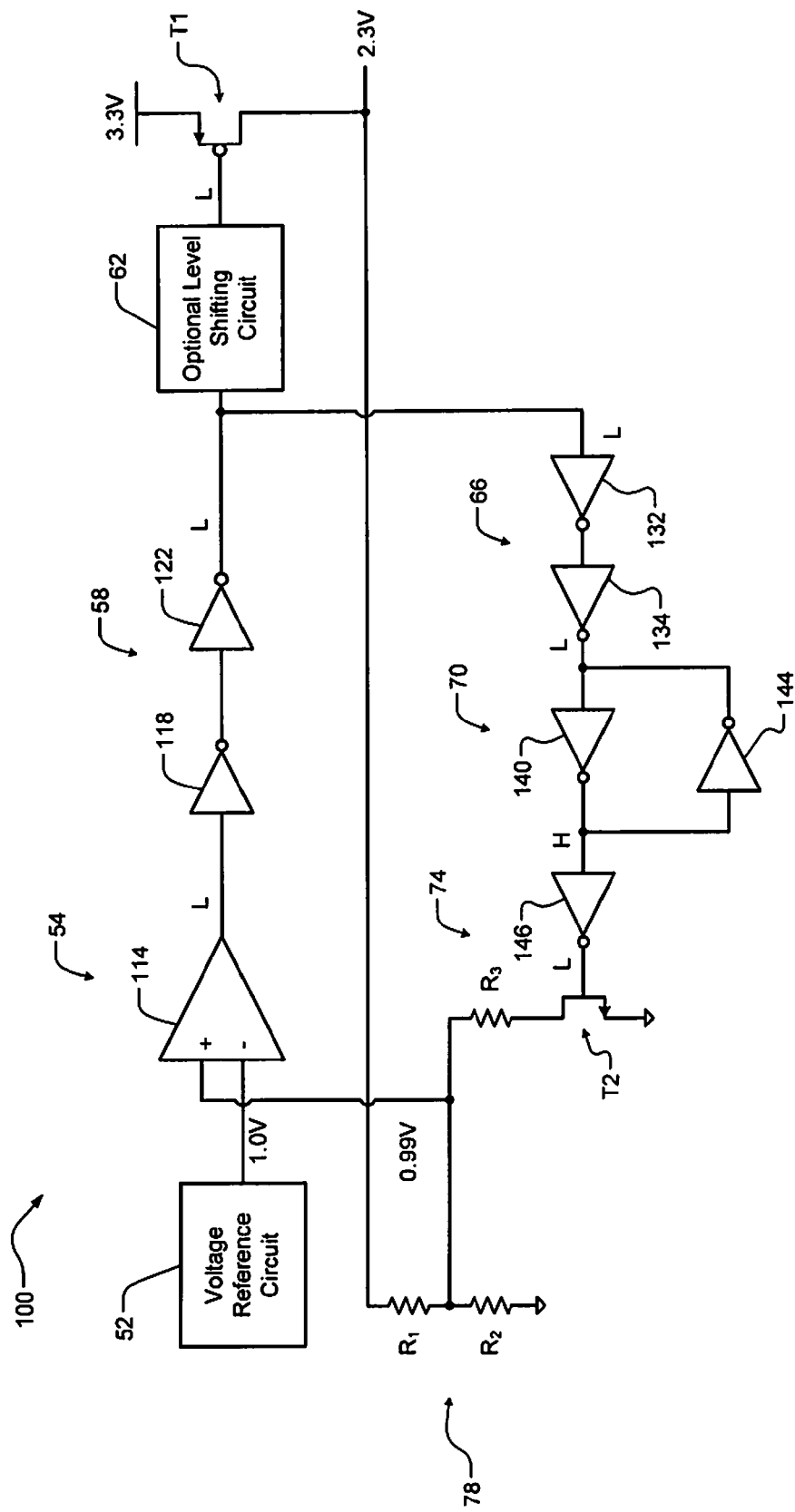
FIGS. 3A and 3B illustrate the voltage regulator of FIG. 2 in different states during operation.
Figure 3B:
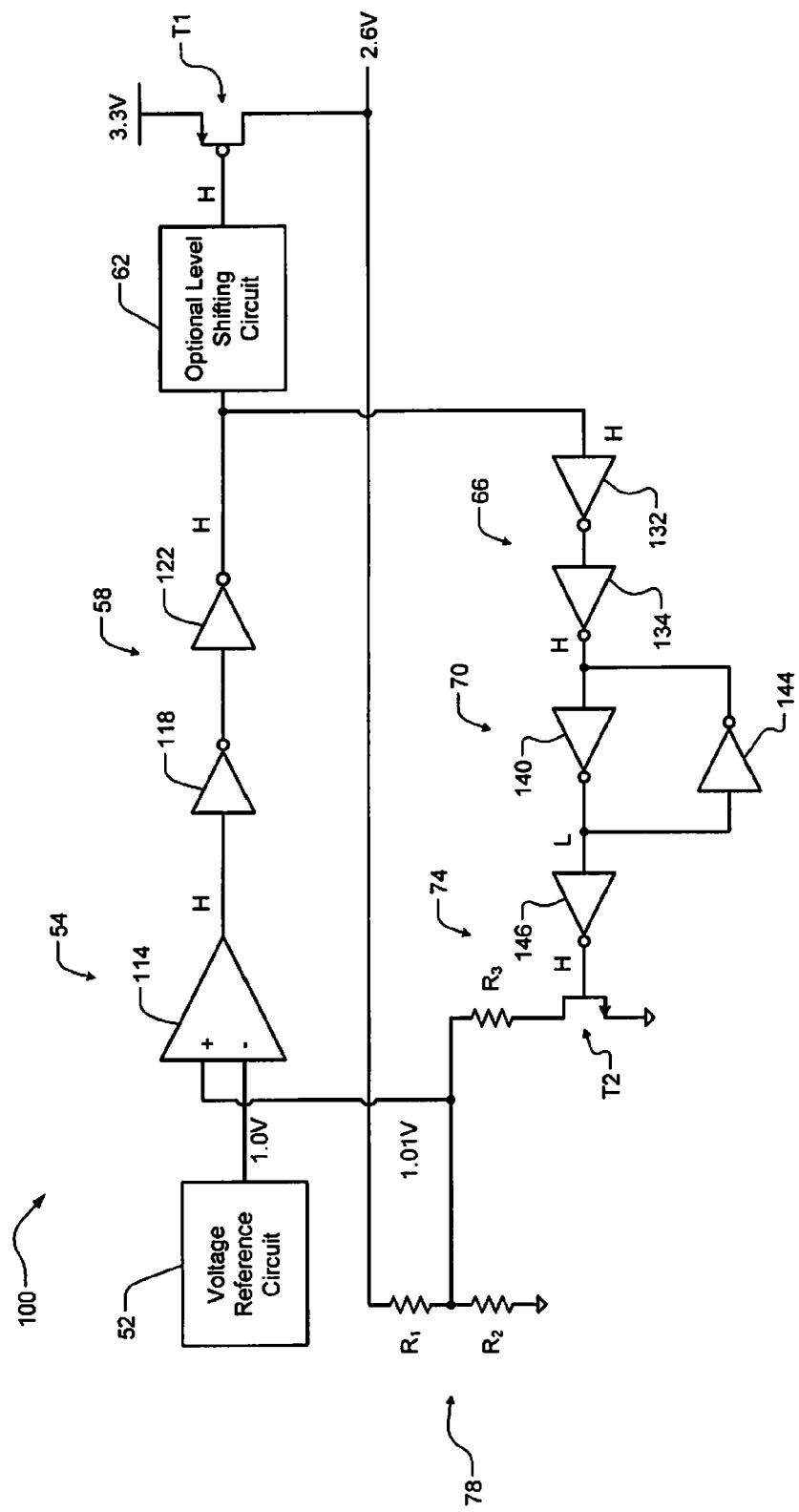

FIGS. 3A and 3B illustrate the voltage regulator 100 of FIG. 2 in different states. FIG. 3A illustrates the voltage regulator 100 when the second voltage reference $V_{ref2}$ is less than the first voltage reference $V_{ref1}$. Example voltage reference levels are presented herein for purposes of illustration only. In this example, the voltage regulator is regulating to a target voltage level of 2.5V. The voltage supply is 3.3V. The voltage reference circuit 78 generates a 1.0V reference. When the output voltage is at 2.3V, the voltage reference circuit 78 generates a reference voltage of 0.99V and the voltage reference adjusting circuit 74 does not impact the second voltage reference $V_{ref2}$.

In this example, the output of the comparing circuit 54 is low. The transistor T1 is ON and the output is pulled towards 3.3V. The optional level shifting circuit 62 is used to shift the voltage from 2.5V to 3.3V to allow the drive transistor T1 to be turned ON and OFF. The input of the buffer/gain circuit 66 is low, which means that the output of the inverter 146 is low. The transistor T2 is OFF. Therefore, the resistor R3 is not connected to ground and does not affect the second voltage reference $V_{ref2}$. With the resistor R3 disconnected in this manner, the second voltage reference is based on:

$$V_{ref2} = V_{S2} \frac{R_2}{R_1 + R_2} \quad (1)$$

In FIG. 3B, eventually the output voltage is pulled higher than the target voltage level. The state of the comparing circuit 54 goes high, which changes the state of the transistor T1 to off and the state of the transistor T2 to on. With the resistor R3 connected in this manner, the second voltage reference is based on:

$$V_{ref2} = V_{S2} \frac{R_2 \| R3}{R_1 + R_2 \| R3} \quad (2)$$

$$\text{where } R_2 \| R_3 = \frac{R_2 R_3}{R_2 + R_3} \quad (3)$$

The voltage regulator turns on the transistor T1 when the output voltage $V_{out}$ falls below an acceptable level. To minimize the possibility that the output voltage $V_{out}$ increases to an excessively high voltage, the feedback path including elements 54, 58, 62, 66, 70, 74 and 78 runs very fast. Digital elements in this path (elements 58, 66 and 70) provide high switching speed and low capacitive loading so that the overall path can respond very quickly.

The voltage regulators according to the present disclosure rely less upon large capacitors (typically about 1 µF to about 20 µF) and performs most of the smoothing inside the voltage regulator. As a result, the capacitor can be significantly smaller while still supporting large supply currents. For example, the capacitor C may have a value that is less than 20 nF. Additional capacitors are not required for voltage regulation. Therefore, the capacitor can be implemented on-chip with significantly lower cost, reduced die size and without using an extra pin for an external capacitor.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A voltage regulator comprising:
   a comparing circuit configured to compare a first voltage reference to a second voltage reference and to generate an output;
   a first circuit configured to apply gain to the output of the comparing circuit and to buffer the output of the comparing circuit;
   a first transistor including a gate in communication with an output of the first circuit, a first terminal in connected to a voltage supply and a second terminal connected to an output of the voltage regulator;
   a second circuit configured to apply gain to the output of the first circuit and to buffer the output of the first circuit;
   a latching circuit configured to receive an output of the second circuit;
   a voltage reference circuit configured to generate the second voltage reference based on the output of the voltage regulator; and
   a reference adjusting circuit configured to receive an output of the latching circuit and to selectively adjust the second voltage reference.

2. The voltage regulator of claim 1, wherein the first circuit includes a first inverter connected in series with a second inverter.

3. The voltage regulator of claim 1, wherein the comparing circuit includes an amplifier including an inverting input connected to the first voltage reference and an non-inverting input connected to the second voltage reference.

4. The voltage regulator of claim 1, wherein the second circuit includes a first inverter connected in series with a second inverter.

5. The voltage regulator of claim 1, wherein the latching circuit includes a first inverter and a second inverter, wherein the first inverter has an input connected to the second circuit and to an output of the second inverter, and wherein the first inverter has an output connected to an input of the second inverter and to the reference adjusting circuit.

6. The voltage regulator of claim 1, wherein the reference adjusting circuit includes:
   a first inverter including an input connected to the latching circuit;
   a first resistor; and
   a second transistor including a gate connected to an output of the first inverter and a first terminal connected one end of the first resistor.

7. The voltage regulator of claim 1, further comprising a voltage reference circuit configured to generate the first voltage reference.

8. The voltage regulator of claim 1, further comprising a level shifting circuit configured to level shift the output of the first circuit, wherein the level shifting circuit is connected between the first circuit and the gate of the first transistor.

9. An integrated circuit comprising:
   the voltage regulator of claim 1; and
   at least one of a chip core and an output driver connected to output of the voltage regulator.

10. The integrated circuit of claim 9, further comprising a capacitor connected to the output of the voltage regulator.

11. The integrated circuit of claim 10, wherein the capacitor has a value that is less than 20 nF.

12. A method for operating a voltage regulator comprising:
   comparing a first voltage reference to a second voltage reference and generating an output;
   applying gain and buffering the output using a first circuit;
   receiving an output of the first circuit at a gate of a first transistor, wherein a first terminal of the transistor connected to a voltage supply and a second terminal of the transistor connected to an output of the voltage regulator;
   applying gain and buffering the output of the first circuit using a second circuit;
   latching an output of the second circuit;
   generating the second voltage reference based on the output of the voltage regulator; and
   selectively adjusting the second voltage reference based on an output of the latching.

13. The method of claim 12, wherein the first circuit includes a first inverter connected in series with a second inverter.

14. The method of claim 12, wherein the second circuit includes a first inverter connected in series with a second inverter.

15. The method of claim 12, wherein the selectively adjusting the second voltage reference is performed by a reference adjusting circuit that includes:
   a first inverter;
   a first resistor; and
   a second transistor including a gate connected to an output of the first inverter and a first terminal connected one end of the first resistor.

16. The method of claim 12, further comprising:
   level shifting the output of the first circuit; and
   outputting a level shifted signal to the gate of the first transistor.

17. The method of claim 12, further comprising connecting a capacitor to the output of the voltage regulator.

18. The method of claim 17, wherein the capacitor has a value in a range that is less than 20 nF.

* * * * *